US008146022B2

(12) United States Patent
Mashita et al.

(10) Patent No.: US 8,146,022 B2
(45) Date of Patent: Mar. 27, 2012

(54) MASK PATTERN DATA GENERATION METHOD, MASK MANUFACTURING METHOD, SEMICONDUCTOR DEVICE MANUFACTURING METHOD, AND PATTERN DATA GENERATION PROGRAM

(75) Inventors: Hiromitsu Mashita, Kawasaki (JP); Toshiya Kotani, Machida (JP); Takashi Obara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 419 days.

(21) Appl. No.: 12/409,068

(22) Filed: Mar. 23, 2009

(65) Prior Publication Data

US 2009/0239177 A1    Sep. 24, 2009

(30) Foreign Application Priority Data

Mar. 24, 2008    (JP) .............................. P2008-075230

(51) Int. Cl.
G06F 17/50    (2006.01)
G06K 9/00    (2006.01)
(52) U.S. Cl. ................ 716/51; 716/50; 716/52; 716/53; 716/54; 716/55; 382/144; 382/145
(58) Field of Classification Search .......... 382/144–145; 716/50–55
See application file for complete search history.

(56) References Cited

U.S. PATENT DOCUMENTS 7,280,945 B1 * 10/2007 Weiner et al. ..................... 703/2
7,353,145 B2 * 4/2008 Tanaka et al. ..................... 703/2
7,404,165 B2 * 7/2008 Misaka et al. ................... 716/52
7,444,616 B2 * 10/2008 Sandstrom et al. ............. 716/53
7,526,748 B2 * 4/2009 Kotani et al. ................... 716/51
7,673,281 B2 * 3/2010 Yamanaka et al. ............. 716/53
2003/0162105 A1 * 8/2003 Nojima et al. ..................... 430/5
2006/0039596 A1 * 2/2006 Nojima et al. ................ 382/144
2006/0039597 A1    2/2006 Kotani et al.
2007/0006115 A1 * 1/2007 Nojima et al. .................. 716/19
2008/0022240 A1 * 1/2008 Nojima .............................. 716/5
2008/0028361 A1 * 1/2008 Yamanaka et al. ............. 716/21
2011/0041104 A1 * 2/2011 Izuha et al. ..................... 716/52

FOREIGN PATENT DOCUMENTS

| JP | 2002-131882 | 5/2002 |
| JP | 2003-303742 | 10/2003 |
| JP | 2006-53248 | 2/2006 |
| JP | 2006-058452 | 3/2006 |

OTHER PUBLICATIONS

Notification of Reasons for Refusal issued by the Japanese Patent Office on May 18, 2010, for Japanese Patent Application No. 2008-075230, and English-language translation thereof.

* cited by examiner

*Primary Examiner* — Stacy Whitmore
(74) *Attorney, Agent, or Firm* — Finnegan, Henderson, Farabow, Garrett & Dunner, L.L.P.

(57) ABSTRACT

According to an aspect of the present invention, there is provided a mask pattern data generation method including: a first step of obtaining a mask data representing from a design pattern by performing a process simulation with a process parameter having a first value; a second step of obtaining a finished pattern from the mask data by performing the process simulation with the process parameter having a different value; a third step of verifying whether a dimensional error therebetween is within an allowable range; and a fourth step of: if the dimensional error is within the allowable range, determining the mask pattern data; and if the dimensional error is not within the allowable range, repeating the above steps by updating the process parameter until the dimensional error becomes within the allowable range.

14 Claims, 8 Drawing Sheets

MASK PATTERN DATA GENERATION METHOD, MASK MANUFACTURING METHOD, SEMICONDUCTOR DEVICE MANUFACTURING METHOD, AND PATTERN DATA GENERATION PROGRAM

CROSS-REFERENCE TO RELATED APPLICATIONS

This application claims priority from Japanese Patent Application No. 2008-075230 filed on Mar. 24, 2008, the entire contents of which are incorporated herein by reference.

BACKGROUND OF THE INVENTION

1. Field of the Invention

An aspect of the present invention relates to a mask pattern data generation method for use in manufacturing a semiconductor device, a mask manufacturing method based on the mask pattern data generation method, a semiconductor device manufacturing method based thereon, and a pattern data generation program for use in manufacturing a semiconductor device.

2. Description of the Related Art

Recent years have seen very remarkable progress in semiconductor manufacturing technology. Semiconductors are mass-produced using fine circuit patterns that have a processing dimension of 0.09 μm or so. As miniaturization of circuit patterns progresses, an effect of a process proximity effect (PPE) on a mask manufacturing process, a lithography process, an etching process, and the like increases. Thus, e.g., when a mask pattern having substantially the same shape as that of a design circuit pattern is transfer-formed on a semiconductor substrate using a lithography process or the like, sometimes, a pattern formed on a substrate largely differs from a design circuit pattern.

Thus, in order to form a circuit pattern on a substrate as designed, a process proximity correction (PPC) process to correct a mask pattern in consideration the process proximity effect is utilized. In the PPC process, a finished pattern to be formed on a substrate is calculated on data by performing a process simulation of a process of transfer-forming a mask pattern on a semiconductor substrate. Then, the mask pattern (represented by mask pattern data) is repeatedly corrected such that the calculated pattern data represents the pattern having substantially the same shape as that of a design pattern.

Hitherto, not only the correction of the dimensional accuracy of a pattern formed on a substrate under a given process condition such as a condition for the PPC but also the correction of a mask pattern to be performed so as to sufficiently assure a process margin (see, e.g., JP-2002-131882-A) have been studied as the correction of the mask pattern. The process margin is defined as an amount of allowable variation of a process parameter corresponding to a mask pattern. That is, the process margin is determined by an allowable varying range of the process parameter, which is set so that the dimensional error between the pattern formed on the substrate and the design pattern, which is caused according to variation of the process parameter in a pattern forming process, is within an allowable error range in which the specifications of a semiconductor device are not impaired.

SUMMARY OF THE INVENTION

According to an aspect of the present invention, there is provided a mask pattern data generation method including: a mask pattern data acquisition step of performing a process simulation with a process parameter having a first reference value for transferring a mask pattern onto a semiconductor substrate, thereby obtaining a mask pattern data representing the mask pattern from a design pattern data representing a design pattern; a finished pattern acquisition step of performing the process simulation with the process parameter having a varied value different from the first reference value, thereby obtaining a finished pattern formed on the semiconductor substrate from the mask pattern data; a verification step of verifying whether a dimensional error between the finished pattern and the design pattern represented by the design pattern data is within an allowable range; and a mask pattern data determination step of: if the dimensional error is within the allowable range, determining the mask pattern data; and if the dimensional error is not within the allowable range, until the dimensional error becomes within the allowable range, repeating: a parameter update step of updating the process parameter; the mask patter acquisition step; the finished pattern acquisition step; and the verification step.

Another aspect of the present invention, there is provided a semiconductor device manufacturing method including: generating a mask pattern data by use of the above-described method; forming a mask pattern on a mask substrate based on the mask pattern data; and transferring the mask pattern formed on the mask substrate on a semiconductor substrate.

Still another aspect of the present invention, there is provided a computer-readable medium storing a program for enabling a computer to perform the above-described method.

DETAILED DESCRIPTION OF THE INVENTION

Hereinafter, an embodiment of the invention is described with reference to the accompanying drawings.

Embodiment

Figure 1:
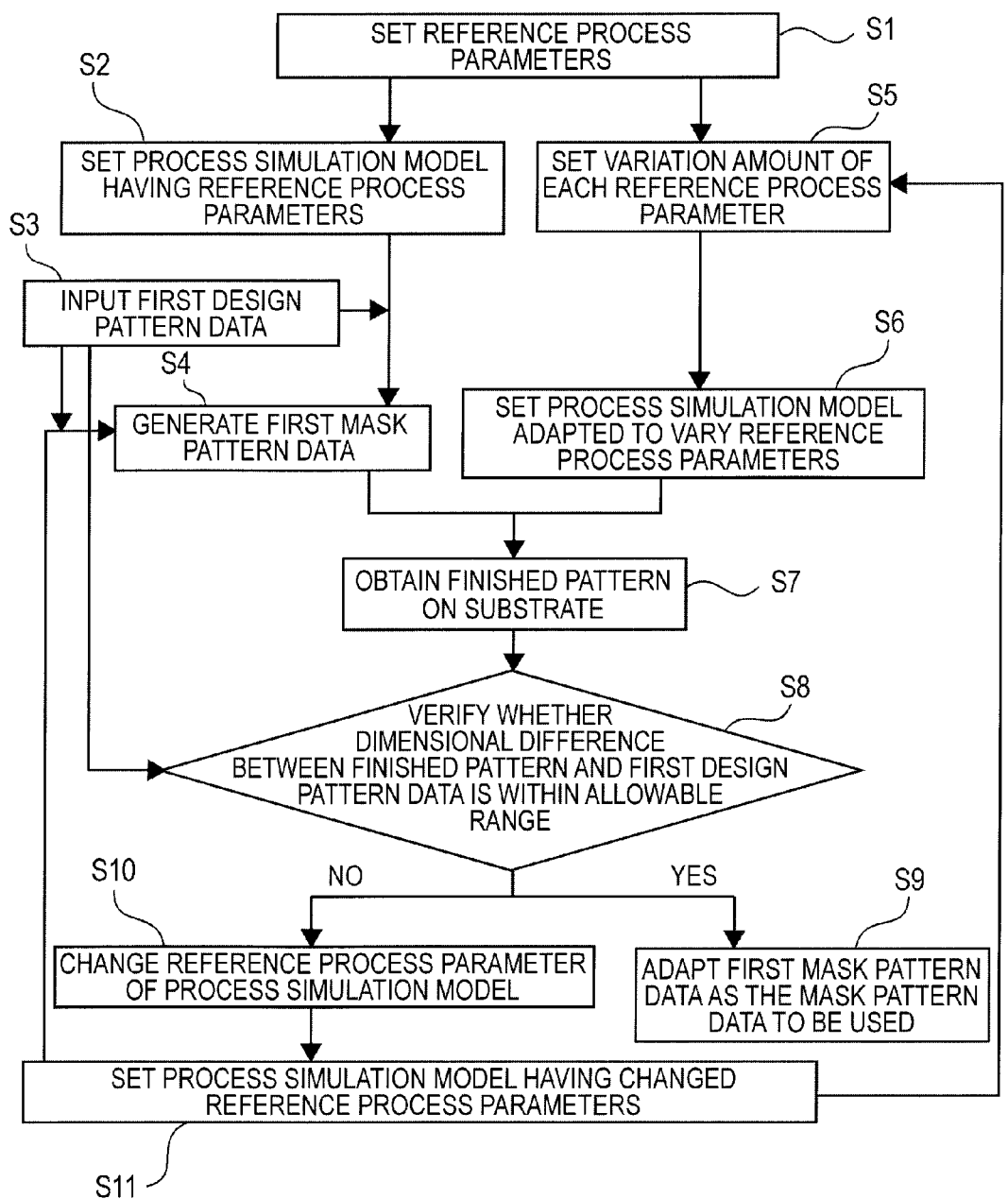
FIG. 1 is a flowchart illustrating a mask pattern data generation method according to an embodiment.

A mask pattern data generation method according to the embodiment is described below with reference to FIG. 1. FIG. 1 is a flowchart illustrating a mask pattern data generation method according to the embodiment of the invention.

In the embodiment, mask pattern data is obtained from the design pattern data representing a pattern to be formed on a semiconductor substrate, in consideration of the PPE and a process margin.

To obtain the mask pattern data, a process simulation for a manufacturing process is performed. In the process simulation, for example, steps from a mask pattern is formed on a mask substrate based on the mask pattern data until a finished pattern is formed onto a semiconductor substrate based on the mask pattern of the mask substrate are simulated. The relationship between the mask pattern data and the finished pattern is modeled by the process simulation. Then, the mask pattern data is appropriately adjusted such that a finished pattern is formed to be the same as the design pattern on the semiconductor substrate.

The process simulation includes, for example, a mask drawing simulation, an optical image simulation, a lithography simulation, a resist model simulation, and a processing simulation.

The mask drawing simulation simulates a mask pattern to be drawn on a mask substrate by a drawing apparatus, from a mask pattern data representing a design of a mask pattern. According to the mask drawing simulation, determinants of various performance capabilities of a drawing apparatus, e.g., a unit of drawing, a drawing grid, or the flatness and warpage of a mask substrate, on which a pattern is drawn, are provided as process parameters. The shape of a mask pattern represented by the mask pattern data, a coverage ratio, and the like are provided as pattern drawing conditions. The simulated result of the mask pattern changes according to the process parameters and the pattern drawing conditions.

The optical image simulation simulates an optical image to be formed on a resist film applied onto a semiconductor substrate, when exposing by an exposure apparatus with a designed mask pattern formed on a mask substrate. Parameters of the exposure apparatus, such as a beam shape, a dose amount, a focus, a polarization degree, aberration, the numerical aperture (NA) of a projection lens and a coherence factor, and parameters of the resist film and a masked film formed under the resist film, such as the materials, the thickness and the exposing light reflectance are used as the process parameters. Mask pattern data, and the shape, the dimension, the distance-to-adjacent-pattern, the coverage ratio and the like of a mask pattern in the mask substrate are specified as the pattern exposure conditions. The simulated result of the optical image formed on the resist film changes according to the process parameters and the pattern exposure conditions.

The resist model simulation simulates a resist pattern from the intensity distribution of an optical image formed on the resist film, by considering the acid diffusion into the resist film in an exposure step and in a post-exposure baking step (PEB step), and by considering the dissolution of the resist film into a developer supplied thereon in a developing step. In the resist model simulation, the resist film material, the diffusion speed of an acid in the resist film, the acid concentration, the change rate in the acid concentration, the developer concentration (or the change rate in the developer concentration), the dissolution rate of the resist film in the developer (or the change ratio in the dissolution rate of the resist film in the developer), and a baking temperature and a baking time in the PEB step are specified as the process parameters. The simulated result of the resist pattern to be formed on the semiconductor substrate changes according to the process parameters.

The lithography simulation simulates a resist mask pattern to be obtained by exposing an optical image corresponding to the designed mask pattern on a resist film on the semiconductor substrate, and by developing the exposed resist film. That is, the lithography simulation includes the optical image simulation and the resist model simulation.

The processing simulation simulates a processed film pattern to be formed on a processed film (masked film) through an etching using a resist pattern as a mask. The type of gas used for etching, a gas flow rate, the type of a chemical solution, a chemical solution concentration, and the material type and the thickness of the processed film are specified as the process parameters.

In the embodiment, mask pattern data is generated so as to form a finished resist pattern to be the same as a designed pattern on a semiconductor substrate through the lithography simulation. In the embodiment, a mask drawing process performed to draw a mask pattern onto a mask substrate based on mask pattern data is omitted, and the drawn mask pattern on the mask substrate is assumed to be the same as the designed mask pattern in the mask pattern data.

First, one or more reference process parameters are set in step S1. Hereinafter, a method for setting the reference process parameters of the lithography simulation is described.

First, among mask pattern data optionally prepared for forming a mask, more particularly, among mask pattern data corresponding to a same shot exposure region on the mask, mask pattern data having a minimum process margin is set as the reference mask pattern data. The mask pattern data having the minimum process margin is considered as mask pattern data representing, e.g., a high-density pattern, a small dimension pattern, or a pattern whose distance to an adjacent pattern is small, as compared with the other mask pattern data.

The reference mask pattern data can be set based on design pattern data representing a circuit pattern formed on the semiconductor substrate. For example, data representing a high-density pattern, a small-dimension pattern, or a pattern whose distance to an adjacent pattern is small, as compared with the other mask pattern data, is set as reference design pattern data, and the mask pattern data therefor is set as reference mask pattern data.

Figure 2A:
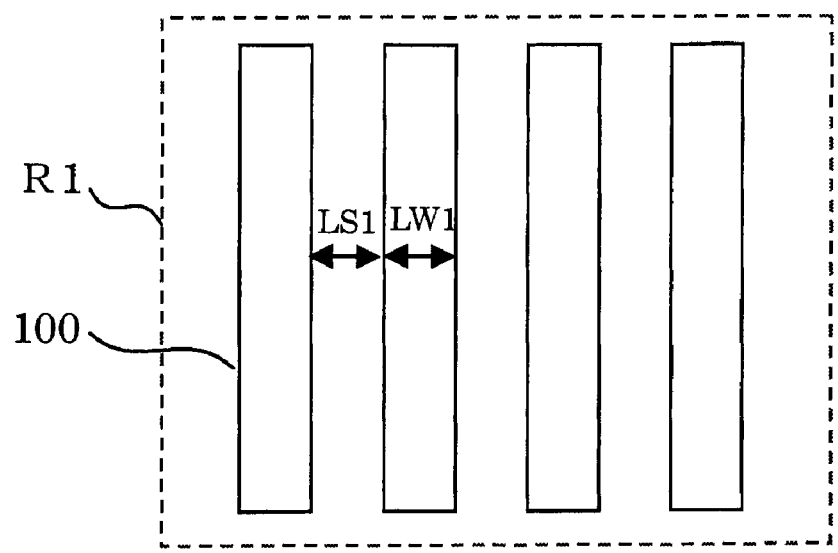
FIGS. 2A and 2B are plan views respectively illustrating reference design pattern data and reference mask pattern data according to the embodiment.
Figure 2B:
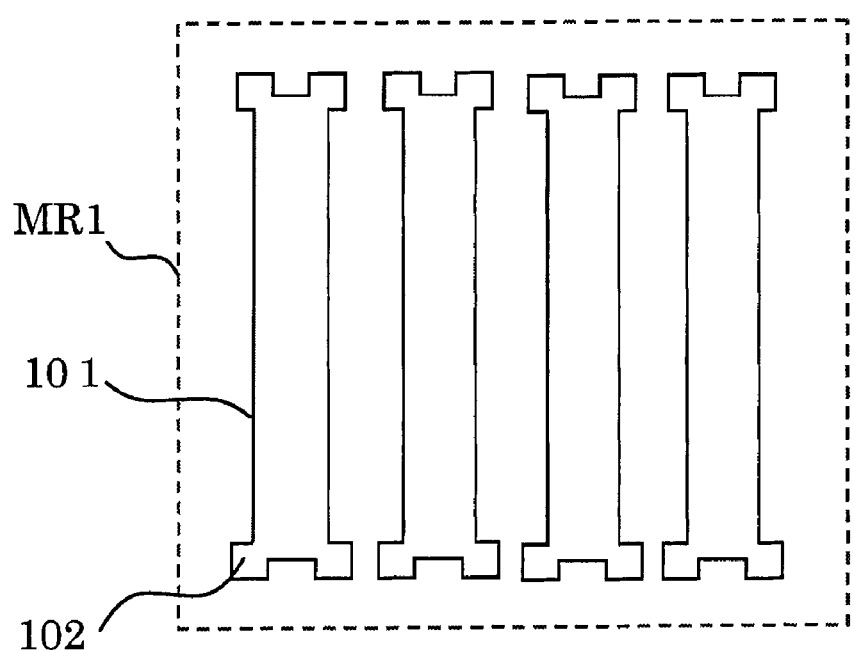

The reference design pattern data and the reference mask pattern data are described below with reference to FIGS. 2A and 2B. FIG. 2A is a plan view illustrating a pattern of the reference design pattern data. FIG. 2B is a plan view illustrating a pattern of the reference mask pattern data.

As illustrated in FIG. 2A, a design pattern 100 represented by the reference design pattern data is a line-and-space pattern placed in a given design pattern region R1. The space width LS1 and the line width LW1 of the line-and-space pattern are fine dimensions, i.e., about 45 nanometers (nm). The reference design pattern data representing the design pattern 100 is, e.g., design pattern data representing a gate pattern of memory cells in a NAND flash memory.

To form such a line-and-space pattern on the semiconductor substrate so as to be the same as the designed pattern or to be within an allowable error range from a designed value, process parameters is more accurately controlled as compared with a case where design patterns having other shapes are formed to be the same as designed. That is, in a process of transferring the line-and-space pattern onto the substrate, an allowable variation amount of the process parameter is extremely small. For example, even when the dose amount of the exposure apparatus, which is one of the process parameters, is slightly varied from a set value in a lithography step, the finished pattern to be transferred onto the semiconductor substrate may largely be shifted from the line-and-space design pattern, and the specification values of the semiconductor device may be shifted from desired values.

In the embodiment, data representing a pattern, such as the line-and-space pattern, whose process margin (i.e., the allowable variation amount of the process parameter) is small, as compared with patterns of other shapes, is set as the reference design pattern data.

As illustrated in FIG. 2B, reference mask pattern data representing a line-and-space reference mask pattern 101 placed in the given mask region MR1 is generated for forming the reference design pattern 100 on the semiconductor substrate. In a lithography step of forming a microscopic mask pattern, sometimes, a pattern transferred onto the semiconductor substrate is not the same as the design pattern due to the PPE. For example, a corner portion of the transferred pattern is thin, as compared with that of the design pattern. Thus, as illustrated in FIG. 2B, a corner correction process in which a given pattern is added to a corner portion 102 of the pattern represented by the reference mask pattern data 101 is preliminarily performed such that the transferred pattern has the same shape as that of the design pattern.

Final reference mask pattern data is generated by repeatedly performing simulating steps of generating mask pattern data, verifying by comparing the predicted finished pattern formed on the substrate by use of the mask pattern data through the process simulation and the reference design pattern of the reference design pattern data, and re-generating a mask pattern by performing a correction process on the mask pattern data, until the shape of the finished pattern becomes the same as that of the designed pattern of the reference design pattern data.

In the foregoing description, the corner correction process has been described as an example of a mask-pattern-data correction process. However, as another example of correction process, a correction process of locally thinning or thickening a given part of the mask pattern represented by the mask pattern data may be performed. Alternatively, a correction process of rounding a corner portion of the pattern represented by the mask pattern data, or a process of resizing the pattern may be performed.

In the step of generating the reference mask pattern data, when the process parameter of the process simulation is varied, the reference mask pattern data to be finally obtained is varied. According to the embodiment, the process parameter used to generate the reference mask pattern data having the process margin that satisfies the allowable range (and preferably, has been optimized) is set as the reference process parameter.

More specifically, first, the reference mask pattern data is tentatively determined. Then, the process simulation is performed by varying the given process parameter used to determine the reference mask pattern data. Then, the finished pattern obtained by transferring the reference mask pattern onto the substrate is compared with the design pattern to check whether the error between the finished pattern and the design pattern is within the allowable range. Consequently, the variation amount (varying range) of the process parameter, i.e., the process margin of the reference mask pattern is evaluated such that the error between the finished pattern and the design pattern is within the allowable range.

When the process margin satisfies the allowable range set by considering, e.g., the parameter variation in the exposure apparatus, the reference mask pattern data is definitely determined, and each parameter used to generate the reference mask pattern data is set as the reference process parameter. Alternatively, the reference process parameter can be obtained by generating a plurality of reference mask pattern data by use of process parameters different from one another, by evaluating the process margins of the reference mask patterns, by determining the reference mask pattern having the process margin that is largest thereamong and satisfies the allowable range, and by setting the process parameter used to generate the determined reference mask pattern as the reference process parameter.

In the embodiment, as the process parameters, attention is focused on the dose amount and the focus of the exposure apparatus. Particularly, since the dose amount greatly affects the shape of the finished pattern, it is necessary to appropriately set the dose amount as the process parameter of the simulation when generating the mask pattern data.

Figure 3:
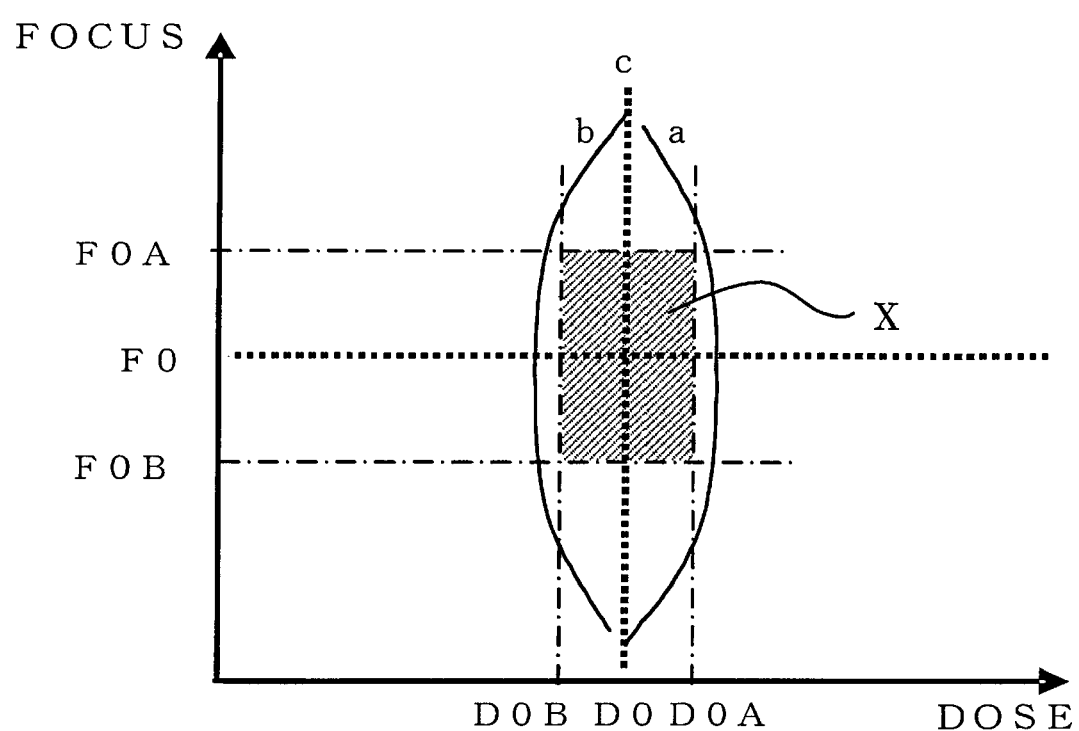
FIG. 3 is a graph illustrating a process margin of a reference mask pattern according to the embodiment.

With reference to FIG. 3, a pattern variation in the finished pattern according to a change of the dose amount and the focus of the exposure apparatus when forming the finished pattern on the semiconductor substrate by exposing the reference mask pattern is described. FIG. 3 is a graph illustrating pattern variation in the finished pattern when transferring the reference mask pattern onto the substrate by varying the dose amount and the focus. That is, FIG. 3 is a graph illustrating the process margin of the reference mask pattern.

An axis of abscissas and an axis of ordinates of FIG. 3 represent process parameters. The axis of abscissas of FIG. 3 represents a dose amount (DOSE). The axis of ordinates of FIG. 3 represents a focus (FOCUS). The dose amount D0 and the focus F0 are reference process parameters. A finished pattern having the same dimension as that designed is formed by transferring the reference mask pattern onto the semiconductor substrate under the process parameter conditions corresponding to the dose amount D0 and the focus F0.

A solid curve a shown in FIG. 3 indicates the conditions of the dose amount and the focus in which the finished pattern is larger by 10% in the width than the reference design pattern. A solid curve b shown in FIG. 3 indicates the conditions of the dose amount and the focus in which the finished pattern is smaller by 10% in the width than the reference design pattern. In addition, a dotted line c shown in FIG. 3 (the dotted line c overlapping with the axis representing the dose amount D0 in FIG. 3) indicates the conditions of the dose amount and the focus in which the finished pattern dimension is in agreement with the reference design pattern dimension.

Generally, a process parameter value set in the exposure apparatus may differ from the effective value thereof, even between the same type apparatuses. FIG. 3 shows variation amounts of the dose amount and the focus of the exposure apparatus. That is, variation in the effective dose amount in the one apparatus or among the plural apparatuses when the dose amount is set at D0 is assumed to range from D0A to D0B (D0A>D0B). Similarly, variation in the effective focus is assumed to range from F0A to F0B (F0A>F0B).

In the embodiment, it is considered that a reference mask patter has a desired process margin, when the dimensional error between the finished pattern and the reference design pattern is within 10% of the reference design pattern dimension while considering variation in the dose amount and the focus. The dimensional error between the patterns can be measured at each edge constituting portion or each measurement point of the patterns. That is, given edge constituting portions are specified, or given measurement points are set in the reference design patterns. Then, edge constituting portions or measurement points corresponding to that of the reference design pattern is set on the reference mask pattern. The position error between a part of the finished pattern, which corresponds to an associated one of the edge constituting portions or the measurement points in the reference mask pattern, and the edge constituting portions or the measurement points in the reference design pattern is measured.

A shaded region X shown in FIG. 3 illustrates varying range of the dose amount and the focus of the exposure apparatus. On the other hand, a dose-amount-focus region, in which the dimensional error between the finished pattern and the reference design pattern is within 10% of the reference design pattern dimension, is enclosed between the solid curves a and b. In FIG. 3, the varying range of the dose amount and the focus is located between the solid curves a and b. In this case, even when the dose amount and the focus are varied, the dimensional error between the finished pattern and the reference design pattern is within the allowable range, and the reference mask pattern has a desired process margin.

When the process margin of the reference mask pattern is less than an allowable value, the reference design pattern can be corrected. Subsequently, similarly, the reference mask pattern is generated using the corrected reference design pattern, the reference process parameter is set, and it is verified again whether the reference mask pattern has a desired process margin. The reference mask pattern can definitely be set by repeating such correction and verification.

After each reference process parameter is set, a process simulation model having the reference process parameters is set in step S2. For example, a simulation model similar to the lithography simulation model at the generation of the reference mask pattern is set.

Subsequently, design pattern data (first design pattern data) differing from the reference design pattern is prepared. The design pattern data is input for the process simulation in step S3. Incidentally, a pattern, the process margin of the mask pattern corresponding to which is larger than the reference design pattern data, is prepared as the first design pattern data. For example, a pattern whose density is low, a pattern whose dimension is large, or a pattern whose distance to an adjacent pattern is large, as compared with the reference design pattern, is prepared as the pattern represented by the first design pattern data.

Next, in step S4, a mask pattern (first mask pattern) is obtained so that a pattern is transfer-formed on the semiconductor substrate to (substantially) match with the pattern represented by the first design pattern data.

Figure 4A:
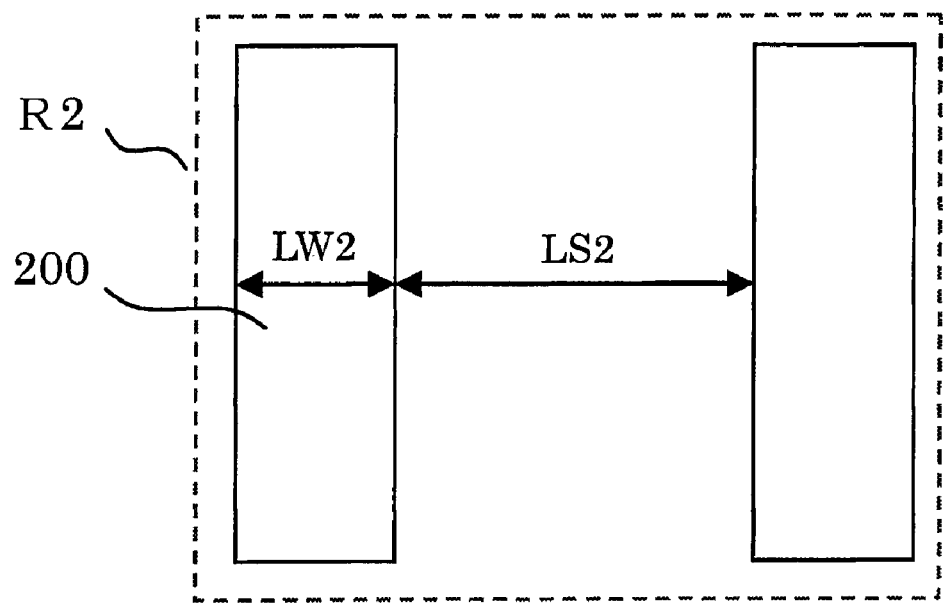
FIGS. 4A and 4B are plan views respectively illustrating patterns represented by first design pattern data and first mask pattern data according to the embodiment.
Figure 4B:
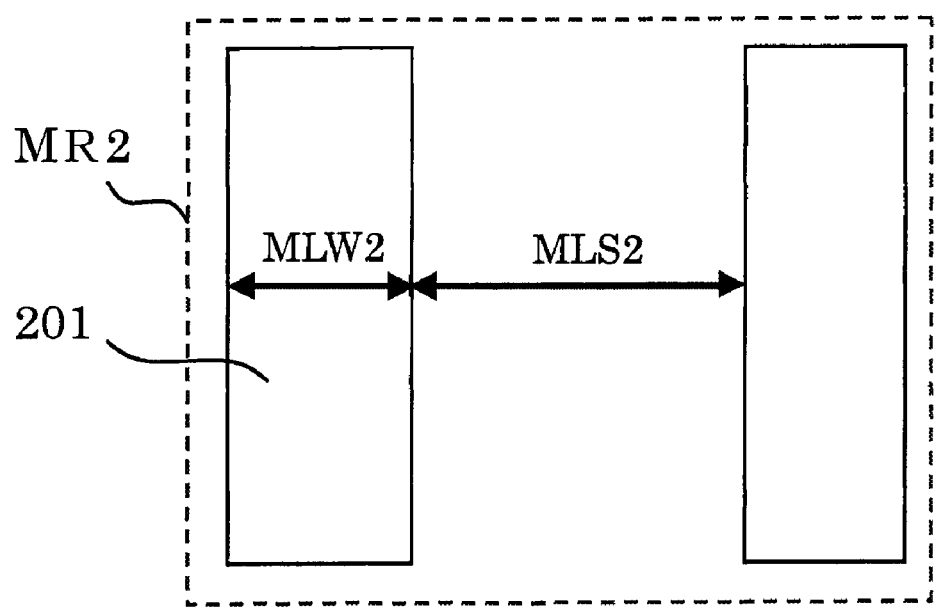

FIGS. 4A and 4B are schematic views respectively illustrating an exemplary pattern represented by first design pattern data and a practical pattern represented by first mask pattern data.

In a pattern region R2 shown in FIG. 4A, a first design pattern 200 of an isolated pattern is located. The first design pattern 200 is, e.g., a design pattern of a peripheral circuit region of a NAND flash memory. Incidentally, the pattern dimension LW2 of the isolated pattern 200 and a space LS2 therefrom to an adjacent pattern are larger than the pattern dimension LW1 of the line-and-space pattern, which is the reference design pattern 100, and the pattern space LS1, respectively.

In a mask pattern region MR2 shown in FIG. 4B, a first mask pattern 201 generated for forming a pattern on the semiconductor substrate to be the same as that designed is located. In order to generate the mask pattern 201, first, the finished pattern to be obtained by transferring the first mask pattern onto the substrate is predicted using the process simulation having the reference process parameter set in step S2. Then, it is verified whether the finished pattern is matched with the first design pattern 200, or whether the dimensional error between the finished pattern and the design pattern 200 is within the allowable range. If the dimensional error between the finished pattern and the design pattern 200 is not within the allowable range, the mask pattern is repeatedly corrected until the dimensional error therebetween becomes within the allowable range.

A correction process of thickening a pattern with respect to the design pattern 200, and a correction process of reducing a distance to an adjacent pattern are performed on the first mask pattern 201 shown in FIG. 4B. That is, the ratio of a distance MLS2 between the mask pattern 201 and an adjacent pattern to the dimension MLW2 of the mask pattern 201 is smaller than that of a distance LW2 between the design pattern 200 and an adjacent pattern to the dimension LW2 of the design pattern 200.

Such correction processes are examples, and various correction processes based on the conventional PPC technology may appropriately be selected and applied thereto.

Next, a variation amount of the reference process parameter is set in step S5. A variation amount of the process parameter may be preliminarily acquired for the exposure apparatus, and the acquired variation amount is utilized as the variation amount of the reference process parameter. As described above, according to the embodiment, the variation (variation amount) in the effective dose amount is assumed to range from D0A to D0B (D0A>D0B), and the variation in the effective focus is assumed to range from F0A to F0B (F0A>F0B).

Then, a process simulation model in which the reference process parameters are varied within the variation amount is set in step S6. The set process simulation model is similar to the process simulation model set in step S2, and differs therefrom in that the latter process simulation model is provided with the variable process parameters. In step S6, a plurality of process simulation models differing from one another at least in a process parameter varied within the variation amount range.

Subsequently, the first mask pattern data is input to the process simulation model set in step S6. Thus, the finished patterns to be formed by transferring the reference mask patterns onto the semiconductor substrate in the lithography step are obtained in step S7. At that time, a plurality of finished patterns differing from one another in shape are obtained according to the plurality of process simulation models set in step S6.

Next, in step S8, it is verified whether the dimensional difference between the pattern of the first design pattern data and the finished pattern obtained by transferring the first mask pattern onto the substrate is within the allowable range.

Figure 5:
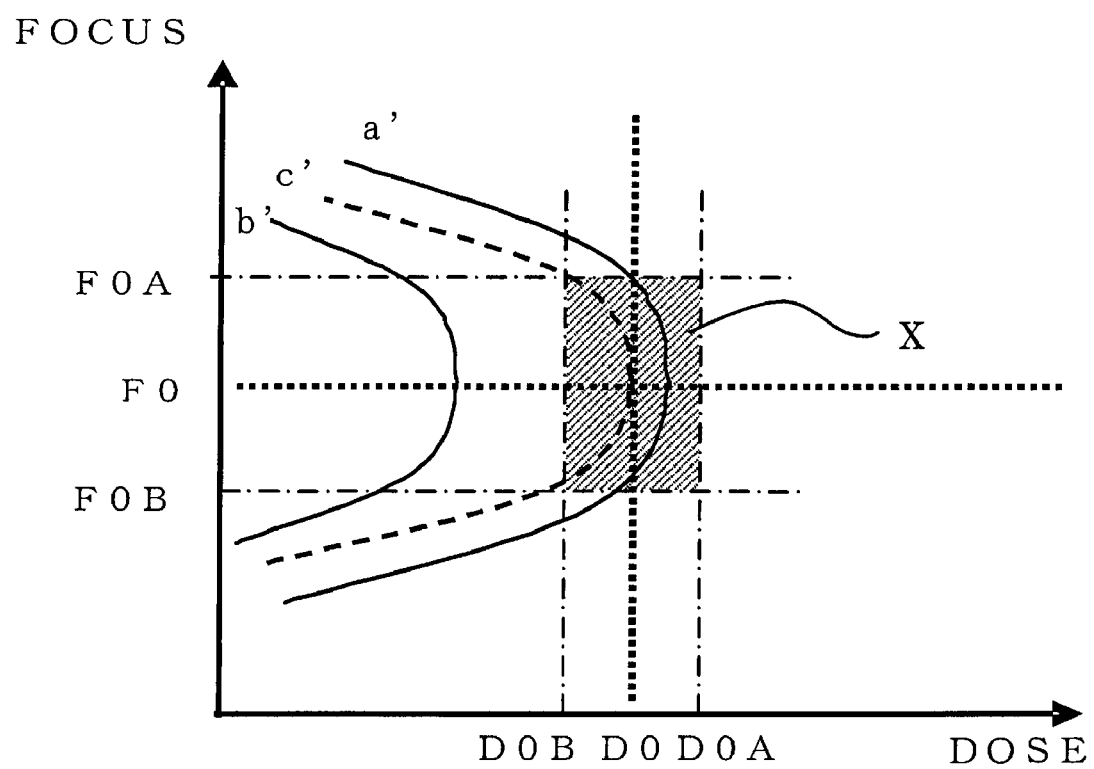
FIG. 5 is a graph illustrating a process margin of a first mask pattern according to the embodiment.

A verification method therefor is described below with reference to FIG. 5. FIG. 5 is a graph illustrating pattern variation in the finished pattern when transferring the first mask pattern onto the substrate by varying the dose amount and the focus. That is, FIG. 5 is a graph illustrating a process margin of the first mask pattern.

Similarly to FIG. 3, an axis of abscissas and an axis of ordinates of FIG. 5 represent process parameters. The axis of abscissas of FIG. 5 represents a dose amount (DOSE). The axis of ordinates of FIG. 5 represents a focus (FOCUS). The dose amount D0 and the focus F0 are reference process parameters. A solid curve a' indicates the conditions of the dose amount and the focus in which the finished pattern dimension is thicken by 10%, as compared with the first design pattern width. A solid curve b' indicates the conditions of the dose amount and the focus in which the finished pattern dimension is thinned by 10%, as compared with the first design pattern width. In addition, a dotted line c' indicates the conditions of the dose amount and the focus in which the finished pattern dimension is in agreement with the first design pattern dimension.

The first mask pattern is adjusted such that the finished pattern dimension is in agreement with the first design pattern dimension under the process conditions of the dose amount D0 and the focus F0. The relationship between the process parameter condition and the finished pattern dimension is obtained by performing a plurality of simulations while appropriately changing the process parameter conditions, and by measuring the finished pattern dimensions.

A shaded region X shown in FIG. 5 indicates varying range of the dose amount and the focus of the exposure apparatus (the dose amount ranges from D0A to D0B, and the focus ranges from F0A to F0B). In the embodiment, it is assumed that the first mask pattern has a desired process margin, when the dimensional error between the finished pattern obtained by transferring the first mask pattern onto the substrate and the first design pattern is within 10% of the first design pattern dimension.

As illustrated in FIG. 5, a dose-amount-focus region, in which the dimensional error between the finished pattern and the first design pattern is within 10% of the first design pattern dimension, is enclosed between the solid curves a' and b'. On the other hand, in FIG. 5, the region X that illustrates varying range of the dose amount and the focus of the exposure apparatus extends also outside the region enclosed between the solid curves a' and b'. Thus, when the dose amount and the focus are varied, the dimensional error between the finished pattern and the first design pattern may not be within the allowable range. That is, the first mask pattern does not have a desired process margin.

Figure 6:
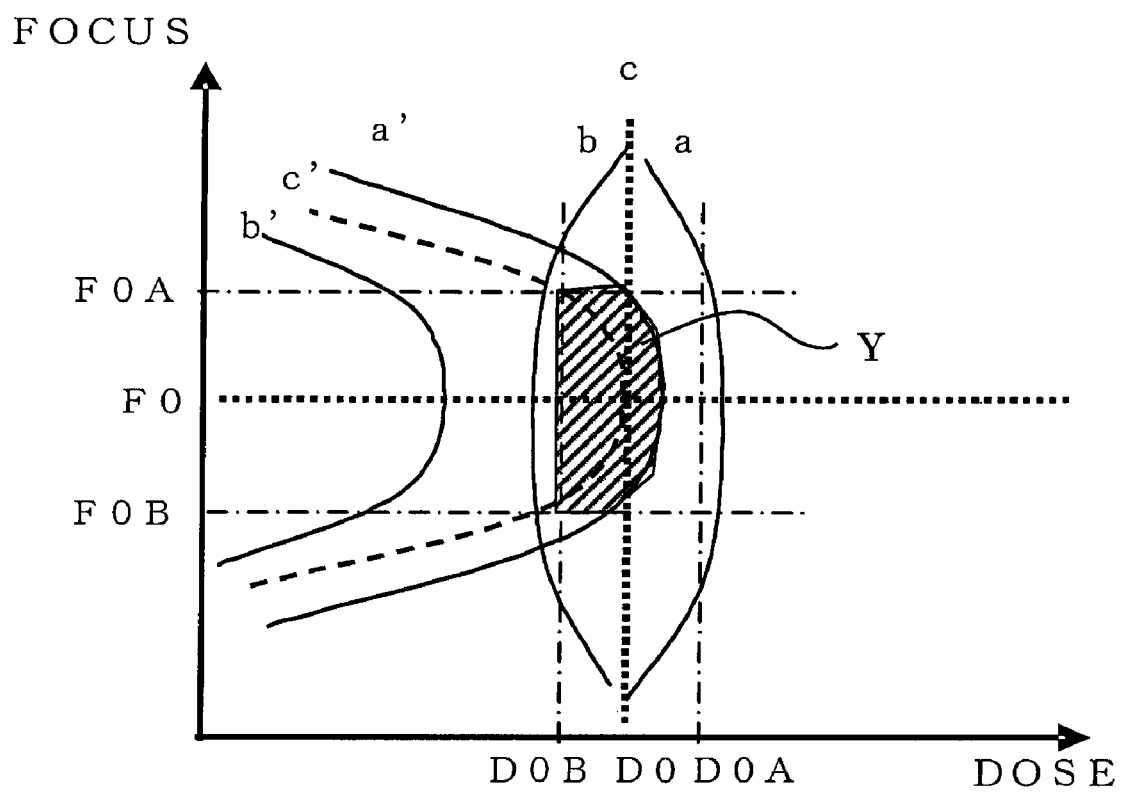
FIG. 6 is a graph illustrating a common process margin of the reference design pattern and the first mask pattern according to the embodiment.

A common process margin between the reference mask pattern and the first mask pattern is described below with reference to FIG. 6. FIG. 6 is a view obtained by combining the process margin of the reference mask pattern shown in FIG. 3 with the process margin of the first mask pattern shown in FIG. 5. Thus, the description of the values and the solid curves, which have already been described, is omitted.

A shaded region Y shown in FIG. 6 represents the common process margin of the reference mask pattern and the first mask pattern inside the varying range of the dose amount and the focus of the exposure apparatus. That is, even when the dose amount parameter and the focus parameter vary within the range of the shaded region Y, the dimensional error between the finished pattern obtained from the reference mask pattern and the reference design pattern is within the allowable range (i.e., within 10% of the reference design pattern dimension). In addition, the dimensional error between the finished pattern obtained from the first mask pattern and the first design pattern is within the allowable range (i.e., within 10% of the design pattern dimension).

When the reference mask pattern and the first mask pattern are formed on the same mask substrate, and when both the patterns are transferred onto the semiconductor substrate by the same shot exposure, it is necessary for forming each of the finished patterns to have a desired dimension so that the common process margin of both the mask patterns is sufficiently assured.

In accordance with a mask pattern generating method according to the embodiment, when it is determined that the dimensional error between the finished pattern obtained from the first mask pattern and the first design pattern is within the allowable range, and that the first mask pattern has a sufficient process margin, the first mask pattern is adapted as the mask pattern data in step S9.

On the other hand, when it is determined that the first mask pattern does not have a desired process margin, the reference process parameter is changed in step S10 so as to expand the process margin of the first mask pattern to exceed the process parameter varying range, and as to expand the common process margin of the reference mask pattern and the first mask pattern. Then, the process simulation model is set again in step S11. Thus, the first mask pattern is re-generated using the reset process simulation model.

As illustrated in FIG. 5, the first mask pattern has a tendency that the finished pattern on the substrate is formed within the allowable error dimension range from the design pattern under the process parameter condition of the dose amount that is less than the amount D0. That is, the region between the solid curves a' and b' indicating the process parameter condition to set the finished pattern to be within the allowable error dimension range from the design pattern is widely distributed in a process parameter condition region corresponding to the dose amount that is less than the amount D0. That is, the first mask pattern has a tendency that the process margin is large in the region of the dose amount that is less than the amount D0, whereas the process margin cannot sufficiently be assured in the region of the dose amount that is more than the amount D0.

When it is determined for the first mask pattern that the process margin cannot sufficiently be assured in the region of the dose amount that is more than the amount D0, the reference process parameter is changed to a dose amount D1 which is less than the amount D0. Then, the reference mask pattern is generated again. Processing to be performed in steps S2 to S8 illustrated in FIG. 1 is repeatedly performed.

That is, first, the reference mask pattern is re-generated while the correction process is appropriately and repeatedly performed on the mask pattern such that the pattern transferred onto the semiconductor substrate using the process simulation, which employs the dose amount D1 as the reference process parameter, is matched with the reference design pattern.

On the other hand, a process simulation model having the changed reference process parameter is re-set in step S2. Then, data representing the first design pattern is input to the re-set process simulation model in step S3. Further, the finished pattern to be transferred onto the substrate is compared with the first design pattern. The first mask pattern is generated by appropriately repeating the correction of the mask pattern in step S4. Incidentally, the generation of the first mask pattern may be performed based on the normal PPC technology.

In step S5, the variation amount is set again corresponding to the changed reference parameter (i.e., the dose amount D1). To set the variation amount, variation in an effective parameter of the exposure apparatus used for transferring the mask pattern onto the semiconductor substrate may be preliminarily and actually measured, and the measured parameter variation may be set as the variation amount. In the embodiment, it is assumed that the effective dose amount (second parameter) varies from D1A to D1B (D1A>D1B), and that the effective focus (second parameter) varies from F1A to F1B (F1A>F1B).

In step S6, a process simulation model adapted to vary the reference process parameter based on the set variation amount is set. The set process simulation model is similar to the model set in step S2 and the model used before the reference process parameter is changed, but differ from these in that the process parameters are varied. The embodiment sets a plurality of process simulation models differing from one another at least in a process parameter varied within the set variation amount.

In step S7, a finished pattern to be formed by transferring a mask pattern onto the semiconductor substrate in the lithography step is obtained by inputting the re-generated first mask pattern to the process simulation model re-set in step S6. At that time, a plurality of finished patterns differing in shape from one another can be obtained corresponding to the plurality of process simulation models re-set in step S6.

In step S8, it is verified again whether the dimensional error between the first design pattern and the finished pattern is within the allowable range.

When it is determined as a verification result that the dimensional error between the finished pattern obtained from the re-generated first mask pattern and the first design pattern is within the allowable range, and that the first mask pattern has a sufficient process margin, the first mask pattern is adapted as the mask pattern data in step S9.

On the other hand, when it is determined that the first mask pattern does not have a desired process margin, each reference process parameter is changed again in step S10. Then, a process simulation model is set again in step S11. The first mask pattern is re-generated using the re-set process simulation model. Subsequently, similarly to the aforementioned process, processing to be performed in steps S2 to S8 is repeatedly performed. That is, the generation of the first mask pattern is repeated until the dimensional error between the finished pattern and the first design pattern becomes within the allowable range.

Figure 7:
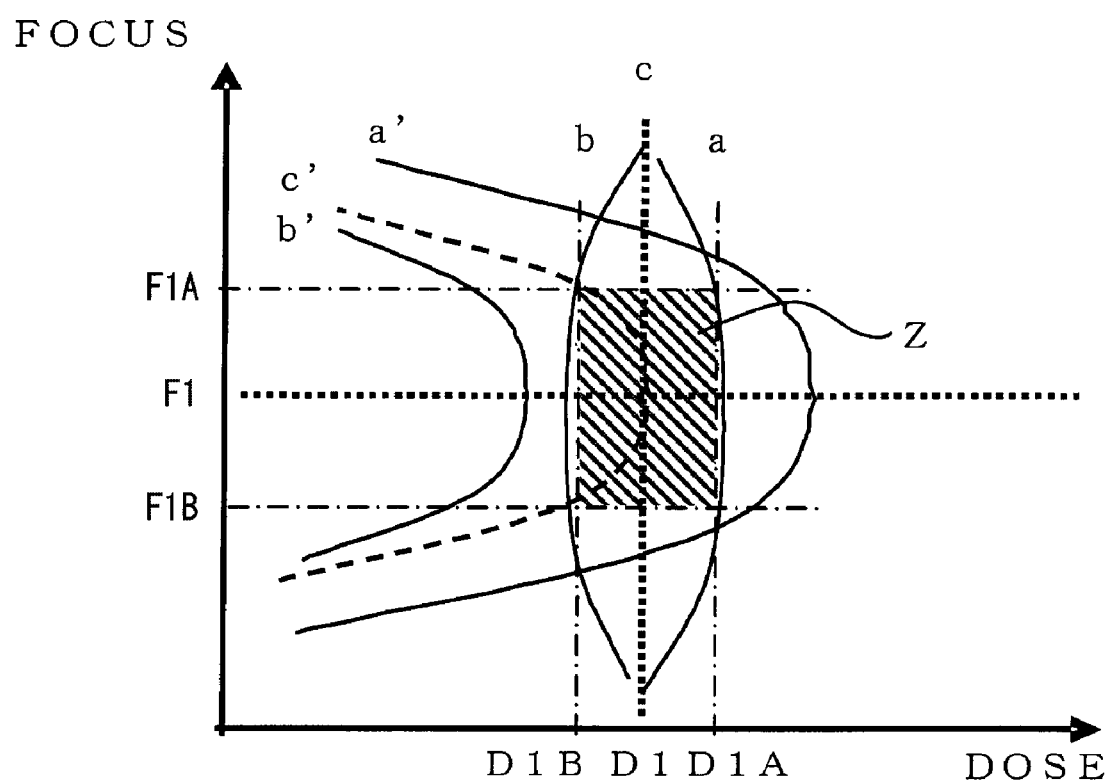
FIG. 7 is a graph illustrating a common process margin of the reference design pattern and the first mask pattern according to the embodiment.

The common process margin of the re-generated reference mask pattern and the re-generated first mask pattern is described below with reference to FIG. 7. FIG. 7 is a graph illustrating pattern variation in each of finished patterns respectively obtained by transferring the re-generated reference mask pattern and the re-generated first mask pattern onto the substrate. That is, FIG. 7 illustrates the common process margin of the reference mask pattern and the first mask pattern. FIG. 7 illustrates such a common process margin, similarly to FIG. 6. The meanings of symbols, solid curves, and the like are similar to those in FIG. 6, except that the reference mask pattern and the first mask pattern are different. The description of the symbols, solid curves, and the like is omitted.

A shaded region Z shown in FIG. 7 represents the common process margin of the reference mask pattern and the first mask pattern inside the varying range of the dose amount D1 and the focus F1 (the dose amount ranges from D1A to D1B, and the focus ranges from F1A to F1B). That is, even when the dose amount parameter and the focus parameter vary within the rage of the shaded region Z, the dimensional error between the finished pattern of the reference mask pattern and the reference design pattern is within the allowable range (i.e., 10% of the reference design pattern dimension). In addition, the dimensional error between the finished pattern of the first mask pattern and the first design pattern is within the allowable range (i.e., 10% of the first design pattern dimension).

According to FIG. 7, varying range of the dose amount and the focus is located in a zone between the solid curves a and b and between the solid curves a' and b'. Thus, even when the dose amount and the focus are varied, the dimensional error between the finished pattern corresponds to the reference mask pattern and the reference design pattern is within the allowable range, and simultaneously, the dimensional error between the finished pattern corresponds to the re-generated first mask pattern and the first design pattern is within the allowable range. Accordingly, it is determined that both the reference mask pattern re-generated through a new process simulation with the changed reference process parameter and the first mask pattern have desired process margins.

Further, when the shaded region Y shown in FIG. 6 and the shaded region Z shown in FIG. 7 are compared with each other, it is understood that the shaded region Z is larger than the shaded region Y, and that the common process margin of the reference mask pattern and the first mask pattern is improved. Although the process margin of the re-generated reference mask pattern is slightly reduced, the process margin of the re-generated first mask pattern is considerably improved. Thus, the common process margin of both the patterns is increased.

In the conventional mask pattern generation step, first, the process parameter is set to assure the process margin for the mask pattern of a specific design pattern having a process margin that is sufficiently low. The mask pattern corresponding to another design pattern is generated using a process simulation having the set process parameters. According to this conventional method, sometimes, a mask pattern corresponding to another design pattern cannot assure sufficient process margin.

On the other hand, according to the embodiment method, a mask pattern is generated while the process parameters corresponding to the process simulation used for generating the mask pattern are appropriately changed so as to assure sufficiently the common process margin of a plurality of mask patterns corresponding to a plurality of design patterns. The mask pattern is generated so that the common process margin includes the process parameter varying range.

Accordingly, e.g., when exposing light is irradiated by the exposure apparatus on to a plurality of mask patterns actually formed on the mask substrate to thereby form a plurality of circuit patterns on the semiconductor substrate, even if the effective dose amount is varied from the set dose amount, the dimensional error between the pattern formed on the semiconductor substrate and the design pattern can be suppressed within the allowable range. Consequently, the required specifications of the semiconductor device to be manufactured can be assured.

In the foregoing description, a mask pattern is generated to assure the common process margin of both the reference mask pattern corresponding to the reference design pattern and the first mask pattern corresponding to the first design pattern. Further, the mask pattern may be formed to assure a common process margin further including another mask pattern corresponding to another design pattern. For example, each mask pattern can be generated such that a sufficient common process margin of mask pattern group to be transferred onto the semiconductor substrate by the same shot exposure is assured.

According to the embodiment, in the mask pattern generation method, when the regions corresponding to the process conditions to be met, which are included in the process margins of the reference mask pattern and the first mask pattern, are not within the range in which the dose amount and the focus are varied, the reference design pattern and the first design pattern can be corrected. The process margin of the mask pattern for forming the design pattern can be increased. Particularly, when the regions corresponding to the process conditions to be met, which are included in the process margins of the reference mask pattern and the first mask pattern, do not overlap with those corresponding to the process conditions, which correspond to the varying ranges of the dose amount and the focus, it is highly necessary to improve the reference design pattern and the first design pattern.

In accordance with the mask pattern generation method according to the embodiment, the mask pattern having small process margin is selected as the reference mask pattern. However, a mask pattern corresponding to an optional design pattern can be selected as the reference mask pattern. For example, an isolated pattern or a hole pattern can be selected as the reference mask pattern, instead of the line-and-space pattern.

An optional process parameter can be set as the reference process parameter.

In accordance with the mask pattern data generation method according to the embodiment, a pattern, the process margin of which is larger than that of the reference mask pattern, is not necessarily selected as the first mask pattern. An optional pattern can be selected as the first design pattern represented by the first design pattern data. In addition, a first mask pattern can be generated corresponding to the selected pattern. For example, a line-and-space pattern or a hole pattern can be selected, instead of an isolated pattern.

Figure 8:
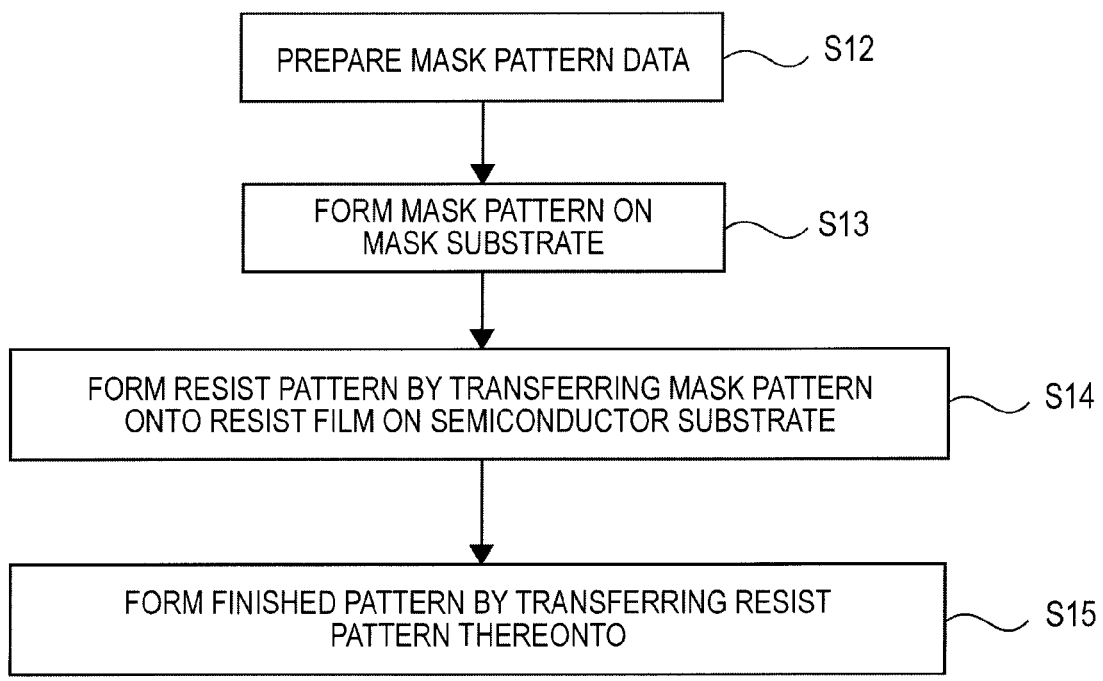
FIG. 8 is a flowchart illustrating a mask manufacturing method and a semiconductor device manufacturing method according to the embodiment.

As illustrated in FIG. 8, in step S12, mask pattern data determined in step S9 is prepared. Then, a mask can be manufactured in step S13, based on mask pattern data, by forming a mask pattern on the mask substrate using a drawing apparatus or the like.

At that time, a mask manufacturing simulation is performed before the mask pattern is formed on the mask substrate. Thus, the dimensional error between the mask pattern represented by the mask pattern data and that to be formed on the mask substrate may be calculated. The mask pattern data can preliminarily be corrected based on the calculated error so as to form a mask pattern on the mask substrate to be the same as that represented by the mask pattern data. In this case, a mask pattern is formed based on the corrected mask pattern data.

As illustrated in FIG. 8, in step S14, the mask pattern formed on the mask substrate is transferred onto a resist film on the semiconductor substrate using the exposure apparatus. Subsequently, a resist pattern is formed by developing the transferred pattern. In step S15, a masked film, which is provided under the resist pattern and contains silicon, is etched using the resist pattern as the mask. At that time, the dimensional difference between the resist pattern and the etched pattern of the masked film caused by the etching process is preliminarily calculated using the processing simulation. Thus, the mask pattern data can preliminarily be corrected based on the calculated error. In this case, a mask pattern is formed on the mask substrate, based on the corrected mask pattern data.

Additionally, a program for causing a computer to execute at least apart of steps (S1 to S11) of the mask pattern generation method according to the embodiment can be created. This program can be provided by being recorded on a recording medium that can be read by the computer, or provided by being downloaded from a server via a network, such as the Internet.

For example, there can be created a pattern data generation program causing a computer to execute a mask pattern data acquisition step of using a process simulation of a process, which has a given process parameter and includes forming a design pattern by transferring a mask pattern on a semiconductor substrate, to obtain, from design pattern data representing the design pattern, mask pattern data representing a mask pattern for forming the design pattern on the substrate, a finished pattern acquisition step of using the process simulation of the process whose process parameter is varied, to obtain, from the mask pattern data, a finished pattern formed on the substrate, a verification step of verifying whether a dimensional error between the finished pattern and the design pattern represented by the design pattern data is within an allowable range, a step of determining, when the dimensional error is within the allowable range, the mask pattern data and of resetting the process parameter by changing the process parameter until the dimensional error becomes within the allowable range, and a mask pattern data determination step of repeatedly performing the finished patter acquisition step using a process simulation of a process having the reset process parameter, the finished pattern acquisition step using the process simulation the reset process parameter of which is varied, and the verification step of verifying whether the dimensional error between the finished pattern and the design pattern is within the allowable range.

According to an aspect of the invention, there is provided a mask pattern generation method, a mask manufacturing method, a semiconductor device manufacturing method, and a pattern data generation program, which improve a process margin.

What is claimed is:

1. A method for generating mask pattern data comprising:
   (A) providing a reference design pattern and a first design pattern, the reference design pattern being different from a first design pattern;
   (B) setting a reference value of a process parameter for a process simulation, the process simulation obtaining a predicted pattern based on a simulation model, a design pattern, and process parameters, the reference value of the process parameter being set such that a reference mask pattern generated according to the reference design pattern and the reference value has a process margin satisfying a target process margin;
   (C) generating a first mask pattern according to the first design pattern and the reference value, the first mask pattern having a first process margin;
   (D) determining whether the first process margin satisfies the target process margin, and:
      if so, adapting data of the first mask pattern as the mask pattern data, and
      if not:
         modifying the reference value that a reference mask pattern according to the reference design pattern and the modified reference value has a process margin satisfying the target process margin, and
         repeating steps (C) and (D).

2. The method according to claim 1, wherein the process parameter includes a dose amount.

3. The method according to claim 1, wherein the process simulation includes a lithography simulation.

4. The method according to claim 1, wherein the reference design pattern is a design pattern having a minimum process margin among a plurality of design patterns corresponding to a same shot exposure region.

5. The method according to claim 4, wherein the reference design pattern is a design pattern having a high density, a small dimension, or a small distance to an adjacent pattern.

6. The method according to claim 1, wherein the target process margin is set by considering a parameter variation in an exposure apparatus.

7. The method according to claim 6, wherein the process parameter includes a dose amount and a focus of the exposure apparatus.

8. The method according to claim 1, wherein a process margin of a mask pattern includes an allowable range of values of the process parameter within which a dimensional error between a predicted pattern and a design pattern corresponding to the mask pattern is smaller than an allowable value, and wherein the dimensional error is acquired by:
   specifying a first edge on the design pattern;
   specifying a second edge corresponding to the first edge on the mask pattern; and
   measuring dimensional errors of the first edge and the second edge on the predicted pattern.

9. The method according to claim 1,
wherein a process margin of a mask pattern includes an allowable range of values of the process parameter within which a dimensional error between a predicted pattern and a design pattern corresponding to the mask pattern is smaller than an allowable value, and
wherein the dimensional error is acquired by:
  setting a first measurement point on the design pattern;
  setting a second measurement point corresponding to the first measurement point on the mask pattern; and
  measuring dimensional errors of the first measurement point and the second measurement point on the wished predicted pattern.

10. The method according to claim 1,
wherein the reference pattern includes a line-and-space pattern, an isolated pattern, or a hole pattern.

11. A semiconductor device manufacturing method comprising:
  generating mask pattern data by the method according to claim 1;
  forming a mask pattern on a mask substrate based on the mask pattern data; and
  transferring the mask pattern formed on the mask substrate onto a semiconductor substrate.

12. A non-transitory computer-readable medium storing a program for enabling a computer to perform the method according to claim 1.

13. A mask pattern data generation method comprising:
  a mask pattern data acquisition step of performing a process simulation with a process parameter having a first reference value for transferring a mask pattern onto a semiconductor substrate, thereby obtaining a mask pattern data representing the mask pattern from a design pattern data representing a design pattern;
  a finished pattern acquisition step of performing the process simulation with the process parameter having a varied value different from the first reference value, thereby obtaining a finished pattern formed on the semiconductor substrate from the mask pattern data;
  a verification step of verifying whether a dimensional error between the finished pattern and the design pattern represented by the design pattern data is within an allowable range; and
  a mask pattern data determination step of:
    if the dimensional error is within the allowable range, determining the mask pattern data; and
    if the dimensional error is not within the allowable range, until the dimensional error becomes within the allowable range, repeating:
      a parameter update step of updating the process parameter;
      the mask pattern acquisition step;
      the finished pattern acquisition step; and
      the verification step,
  wherein, if the dimensional error is not within the allowable range, the mask pattern data determination step repeats:
    the parameter update step of updating the process parameter from an (N)-th reference value to an (N+1)-th reference value, N being integer equal to or larger than 1;
    the mask pattern acquisition step of obtaining an updated mask pattern data corresponds to the design pattern by performing the process simulation with the process parameter having the (N+1)-th reference value;
    the finished pattern acquisition step of obtaining an updated finished pattern from the updated mask pattern data by performing the process simulation with the process parameter having the varied value different from the (N+1)-th reference value; and
    the verification step of verifying whether the dimensional error is within the allowable range.

14. The method according to claim 13,
wherein the parameter update step updates the process parameter from the (N)-th reference value to the (N+1)-th reference value, the (N+1)-th reference value being different from the (N)-th reference value.

* * * * *

UNITED STATES PATENT AND TRADEMARK OFFICE
CERTIFICATE OF CORRECTION

PATENT NO.        : 8,146,022 B2
APPLICATION NO.   : 12/409068
DATED             : March 27, 2012
INVENTOR(S)       : Mashita et al.

Page 1 of 1

It is certified that error appears in the above-identified patent and that said Letters Patent is hereby corrected as shown below:

Claim 9, column 15, lines 13-14, change "on the wished predicted pattern." to --on the predicted pattern.--

Signed and Sealed this
Third Day of July, 2012

David J. Kappos
*Director of the United States Patent and Trademark Office*